United States Patent
Shin

(10) Patent No.: US 9,640,626 B2
(45) Date of Patent: May 2, 2017

(54) SEMICONDUCTOR DEVICE WITH BURIED GATES AND BIT LINE CONTACTING PERIPHERAL GATE

(71) Applicant: SK hynix Inc., Gyeonggi-do (KR)

(72) Inventor: Jong-Han Shin, Gyeonggi-do (KR)

(73) Assignee: Sk Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/014,586

(22) Filed: Feb. 3, 2016

(65) Prior Publication Data

US 2016/0155810 A1 Jun. 2, 2016

Related U.S. Application Data

(62) Division of application No. 13/325,552, filed on Dec. 14, 2011, now Pat. No. 9,257,436.

(30) Foreign Application Priority Data

Dec. 15, 2010 (KR) ........................ 10-2010-0128055

(51) Int. Cl.
*H01L 29/423* (2006.01)
*H01L 27/108* (2006.01)
*H01L 27/105* (2006.01)

(52) U.S. Cl.
CPC ...... *H01L 29/4236* (2013.01); *H01L 27/1052* (2013.01); *H01L 27/10876* (2013.01); *H01L 27/10888* (2013.01); *H01L 27/10894* (2013.01); *H01L 29/42352* (2013.01); *H01L 29/42356* (2013.01); *H01L 27/10873* (2013.01)

(58) Field of Classification Search
CPC ............. H01L 29/4236; H01L 27/1052; H01L 29/42356; H01L 29/42352; H01L 27/10888
See application file for complete search history.

(56) References Cited

U.S. PATENT DOCUMENTS

| 2004/0188773 A1* | 9/2004 | Kidoh | ............... H01L 27/10894 257/390 |
| 2009/0085084 A1* | 4/2009 | Tegen | ................. H01L 21/0274 257/306 |
| 2011/0133283 A1* | 6/2011 | Park | ................ H01L 21/823456 257/368 |
| 2011/0309435 A1* | 12/2011 | Hwang | ............. H01L 27/10894 257/330 |

* cited by examiner

*Primary Examiner* — Michael Jung
(74) *Attorney, Agent, or Firm* — IP & T Group LLP

(57) ABSTRACT

A semiconductor device includes a substrate having a cell region and a peripheral region, a buried gate formed over the substrate of the cell region, a peripheral gate formed over the substrate of the peripheral region and comprising a conductive layer, an inter-layer dielectric layer that covers the substrate, and a peripheral bit line formed inside the inter-layer dielectric layer and contacting the conductive layer.

6 Claims, 7 Drawing Sheets

SEMICONDUCTOR DEVICE WITH BURIED GATES AND BIT LINE CONTACTING PERIPHERAL GATE

CROSS-REFERENCE TO RELATED APPLICATIONS

This application is a division of U.S. patent application Ser. No. 13/325,552 filed on Dec. 14, 2011 and issued as U.S. Pat. No. 9,257,436, which claims priority of Korean Patent Application No. 10-2010-0128055, filed on Dec. 15, 2010. The disclosure of each of the foregoing applications is incorporated herein by reference in its entirety.

BACKGROUND

1. Field

Exemplary embodiments of the present invention relate to a semiconductor device fabrication technology, and more particularly, to a semiconductor device including buried gates (BG) and a method for fabricating the same.

2. Description of the Related Art

As semiconductor devices become smaller in size, a semiconductor device may not be able to realize diverse device characteristics. As design rules are less than approximately 40 nm, the formation of a gate structure, a bit line structure, and a contact structure may have technical limitations. Even if such structures are formed, the desired device characteristics may not be achieved. To achieve the desired device characteristics, semiconductor devices may form buried gates (BG) in a substrate.

FIG. 1 is a cross-sectional view illustrating a conventional semiconductor device including buried gates.

Referring to FIG. 1, the conventional semiconductor device with buried gates includes an isolation layer 12 that defines an active region 13 over a substrate 11. The substrate includes a cell region and a peripheral region. In the cell region of the substrate 11, each buried gate includes a trench 15, a gate insulation layer (not shown), a gate electrode 16, and a gate hard mask layer 17. Over the substrate 11, landing plugs 14 are formed. An isolation layer 12 is formed to isolate the landing plugs 14 from another and to isolate the landing plugs 14 from the buried gates. In the peripheral region of the substrate 11, peripheral gates 21 are formed, and spacers 22 are formed on the sidewalls of each peripheral gate 21. Each peripheral gate includes a peripheral gate insulation layer 18, a peripheral gate electrode 19, and a peripheral gate hard mask layer 20. An inter-layer dielectric layer 23 is formed over the substrate 11, and a storage node contact plug 25 and a cell bit line 28 are formed in the inter-layer dielectric layer 23 of the cell region. A portion of a peripheral bit line 31 is coupled with the peripheral gate electrode 19 and formed in the inter-layer dielectric layer 23 of the peripheral region, while a portion of the peripheral bit line 32 is formed above the inter-layer dielectric layer 23. FIG. 1 also illustrates a cell bit line hard mask layer 29, and a peripheral bit line hard mask layer 33.

According to the conventional technology, the peripheral bit line 32 is disposed over the inter-layer dielectric layer 23 of the peripheral region. As a result, subsequent processes become complex and procedurally more difficult. More specifically, step height is inevitably formed between the cell region and the peripheral region because the peripheral bit line 32 is formed over the inter-layer dielectric layer 23. The step height makes the subsequent processes of forming an inter-layer dielectric layer covering the peripheral bit line 32 in the peripheral region and forming storage nodes in the cell region be complicated, and increases the procedural difficulty. Also, the step height between the cell region and the peripheral region cracks an etch stop layer (not shown) interposed between the inter-layer dielectric layer 23 and a mold-forming insulation layer (not shown) for forming a mold, and damages the existing substrate structure during a subsequent dip-out process.

SUMMARY

An embodiment of the present invention is directed to a semiconductor device with buried gates that may remove the step height occurring between a cell region and a peripheral region due to the presence of a peripheral bit line, and a method for fabricating the semiconductor device.

In accordance with an embodiment of the present invention, a semiconductor device includes: a substrate having a cell region and a peripheral region; a buried gate formed over the substrate of the cell region; a peripheral gate formed over the substrate of the peripheral region and including a conductive layer; an inter-layer dielectric layer that covers the substrate; and a peripheral bit line formed inside the inter-layer dielectric layer and contacting the conductive layer.

In accordance with another embodiment of the present invention, a method for fabricating a semiconductor device includes: forming a gate including a conductive layer over a substrate; forming an inter-layer dielectric layer that covers the gate; forming a damascene pattern that exposes the conductive layer by selectively etching the inter-layer dielectric layer and the gate; and forming a bit line that fills the damascene pattern.

In accordance with yet another embodiment of the present invention, a method for fabricating a semiconductor device includes: preparing a substrate having a cell region and a peripheral region; forming a buried gate over the substrate of the cell region; forming a peripheral gate including a conductive layer over the substrate of the peripheral region; forming a first inter-layer dielectric layer over the substrate; performing a planarization process until the peripheral gate is exposed; forming a second inter-layer dielectric layer over the first inter-layer dielectric layer; forming a peripheral damascene pattern that exposes the conductive layer by selectively etching the peripheral gate and the second inter-layer dielectric layer of the peripheral region; and forming a peripheral bit line that fills the peripheral damascene pattern.

DETAILED DESCRIPTION

Figure 1:
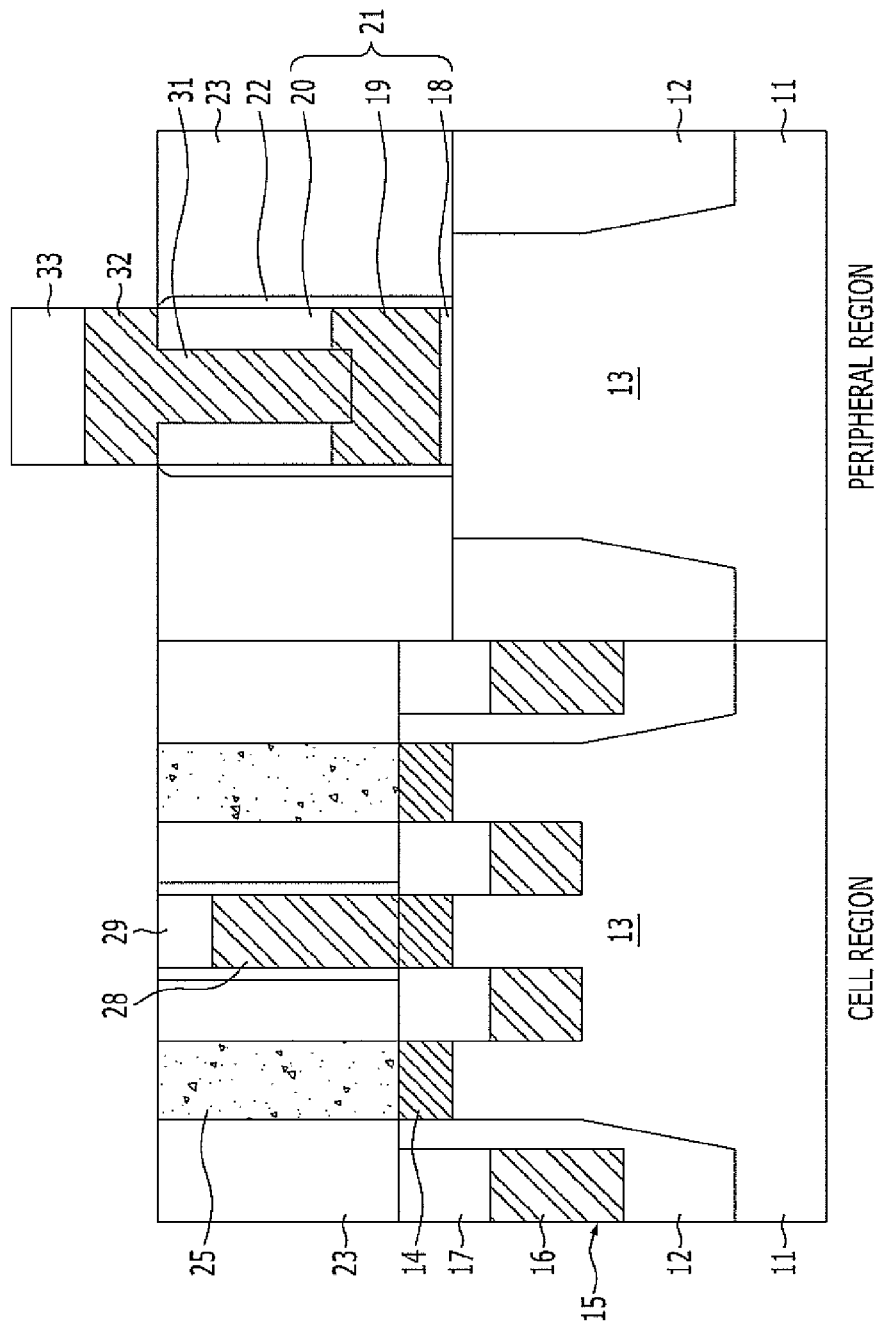
FIG. 1 is a cross-sectional view illustrating a conventional semiconductor device including buried gates.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

A semiconductor device including buried gates and not including a step height formed between a cell region and a peripheral region, and a method for fabricating the semiconductor device including the buried gates is disclosed hereafter. To form the semiconductor device, the peripheral bit line and the cell bit line are formed inside of an inter-layer dielectric layer.

Figure 2:
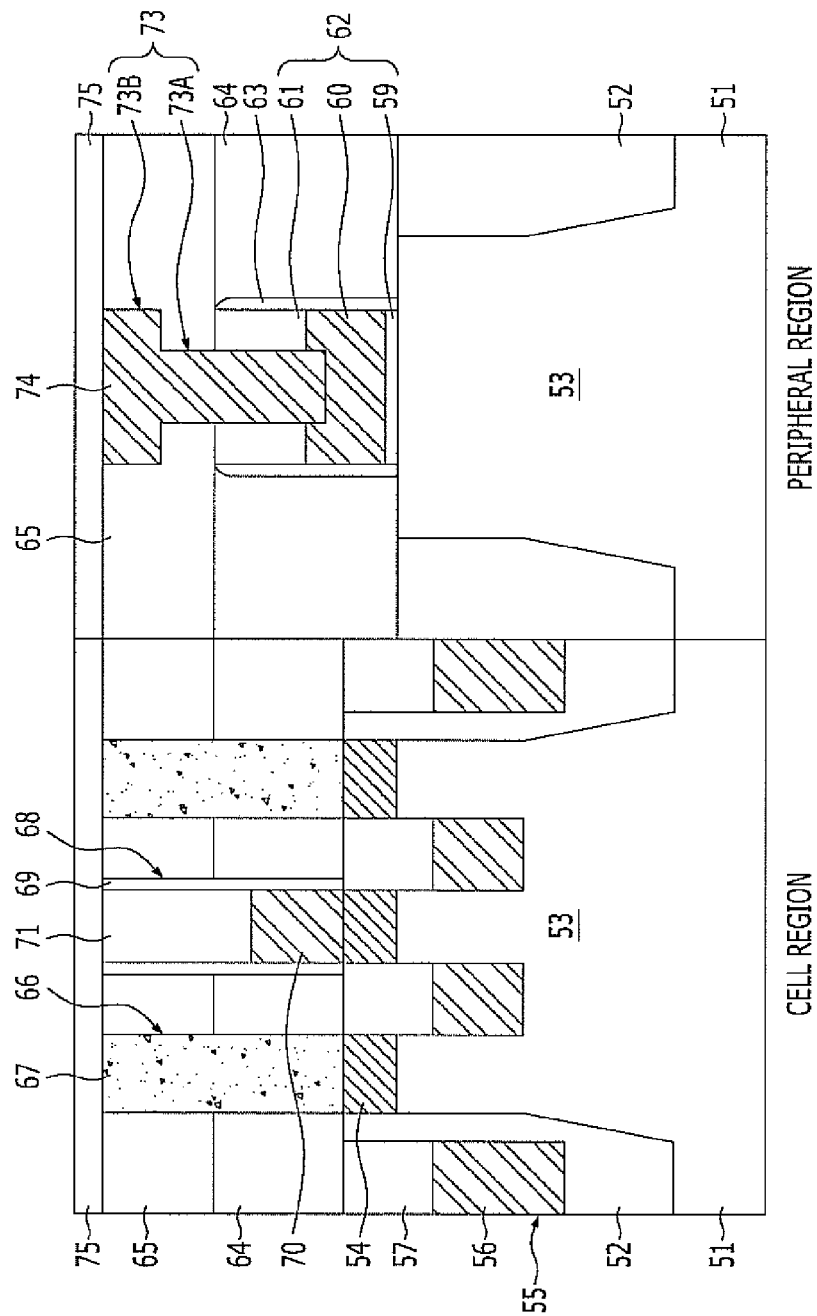
FIG. 2 is a cross-sectional view illustrating a semiconductor device including buried gates in accordance with an embodiment of the present invention.

FIG. 2 is a cross-sectional view illustrating a semiconductor device including buried gates in accordance with an embodiment of the present invention.

Referring to FIG. 2, the semiconductor device including buried gates includes a substrate 51 having a cell region and a peripheral region, buried gates formed in the cell region of the substrate 51, peripheral gates 62 formed in the peripheral region of the substrate 51, an inter-layer dielectric layer formed over the substrate 51 to cover the peripheral gates 62, storage node contact plugs 67 formed inside of the inter-layer dielectric layer of the cell region, and cell bit lines 70 formed inside of the inter-layer dielectric layer of the cell region, and a peripheral bit line 74 formed inside of the inter-layer dielectric layer of the peripheral region to contact a peripheral gate electrode 60. Also, an etch stop layer 75 is formed in the cell region and the peripheral region. The etch stop layer 75 protects the lower structure during a subsequent process to form storage nodes in the cell region.

An isolation layer 52 that defines an active region 53 is formed in the cell region of the substrate 51. Each buried gate includes a line-type trench 55, a gate insulation layer (not shown), a gate electrode 56, and a gate hard mask layer 57. The line-type trench 55 crosses an active region 53 and the isolation layer 52. The gate insulation layer fills a portion of the trench 55. The gate hard mask layer 57 fills the remaining portion of the trench 55. Landing plugs 54, which are defined by the isolation layer 52, and the buried gates are formed in the cell region of the substrate 51.

The isolation layer 52 that defines the active region 53 is formed in the peripheral region of the substrate 51. In the peripheral region of the substrate 51, peripheral gates 62 are formed. Each peripheral gate 62 has a stacked structure. To form the stack structure, a peripheral gate insulation layer 59, a peripheral gate electrode 60, and a peripheral gate hard mask layer 61 are sequentially stacked. The peripheral gate electrode 60 may be formed of a conductive layer.

An inter-layer dielectric layer is formed over the substrate 51 in both the cell region and the peripheral region. The inter-layer dielectric layer has a stacked structure formed by sequentially stacking a first inter-layer dielectric layer 64 and a second inter-layer dielectric layer 65. The first inter-layer dielectric layer 64 has its upper surface disposed on the same plane as the upper surfaces of the peripheral gates 62, and the second inter-layer dielectric layer 65 is formed over the first inter-layer dielectric layer 64. The first inter-layer dielectric layer 64 and the second inter-layer dielectric layer 65 may be formed of the same material, and the second inter-layer dielectric layer 65 may have a higher dielectric constant than the first inter-layer dielectric layer 64.

Storage node contact plugs 67 and cell bit lines 70 that penetrate the first inter-layer dielectric layer 64 and the second inter-layer dielectric layer 65 are formed inside of the first inter-layer dielectric layer 64 and the second inter-layer dielectric layer 65. The cell bit line 70 fills a portion of a cell damascene pattern 68 that has a line shape stretched in a direction crossing the buried gates. Bit line spacers 69 are formed on the sidewalls of the cell damascene pattern 68, and a bit line hard mask layer 71 is formed by filling the remaining portion of the cell damascene pattern 68.

A peripheral bit line 74 is formed inside of the inter-layer dielectric layer of the peripheral region, and fills a peripheral damascene pattern 73. The peripheral damascene pattern 73 includes a hole pattern 73A that exposes the peripheral gate electrode 60 and a line pattern 73B that is coupled with the hole pattern 73A.

Since the above-described semiconductor device has a structure where the peripheral bit line 74 is buried inside of the inter-layer dielectric layer, the formation of a step height between the cell region and the peripheral region may be prevented. Therefore, procedural difficulty of a subsequent process for forming storage nodes in the cell region may be reduced, and the etch stop layer 75 may be protected from cracking that is caused due to the presence of the step height.

FIGS. 3A to 3E are cross-sectional views illustrating a method for fabricating a semiconductor device including buried gates in accordance with an embodiment of the present invention.

Figure 3A:
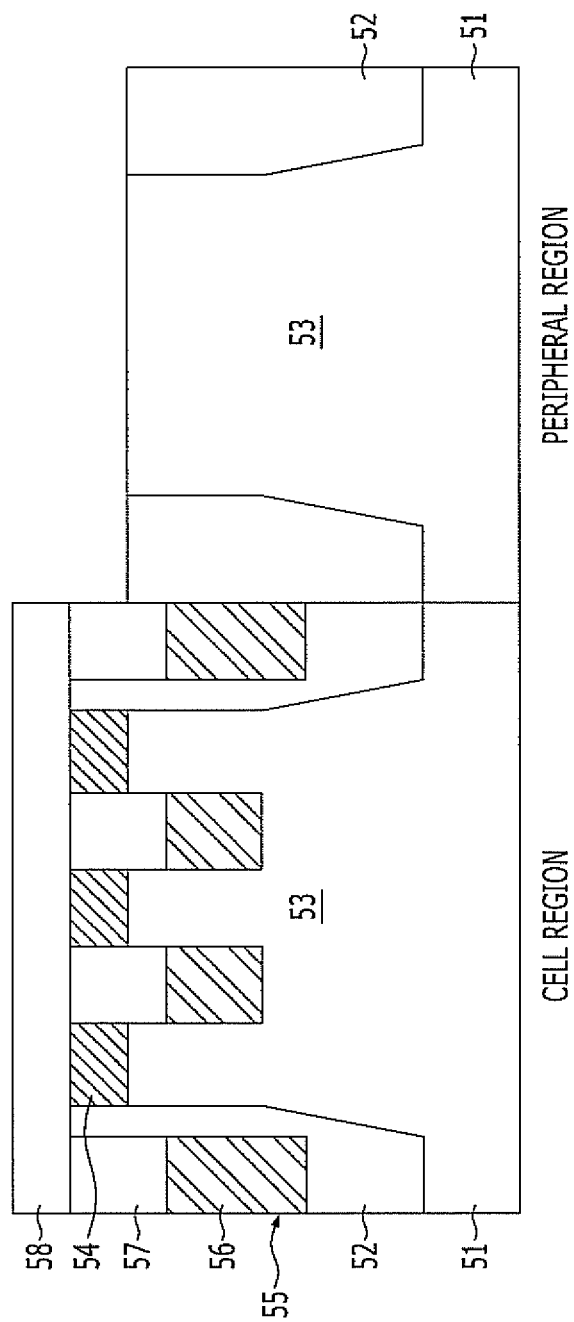
FIGS. 3A to 3E are cross-sectional views illustrating a method for fabricating a semiconductor device including buried gates in accordance with an embodiment of the present invention.

Referring to FIG. 3A, a hard mask pattern (not shown) is formed over a substrate 51 having a cell region and a peripheral region, and an isolation layer 52 defining an active region 53 is formed by using the hard mask pattern. The isolation layer 52 may be formed through a Shallow Trench Isolation (STI) process.

Subsequently, the hard mask pattern of the cell region is removed, and a landing plug-forming conductive layer (not shown) fills a groove that is formed as a result of the removal of the hard mask pattern of the cell region.

Subsequently, landing plugs 54 are formed over the substrate 51 of the cell region, and a plurality of buried gates are formed over the substrate 51. The buried gates may be formed by first selectively etching the landing plug-forming conductive layer (not shown), the active region 53, and the isolation layer 52 to form trenches 55. After the forming the trenches 55, the buried gates may be formed by forming a gate insulation layer (not shown) on the surfaces of the trenches 55, forming a gate electrode 56 filling a portion of each trench 55, and forming a gate hard mask layer 57 filling the other portion of each trench 55 over the gate electrode 56. The landing plugs 54 are formed when the trenches 55 for forming buried gates are formed.

Subsequently, a first capping layer 58 that covers the cell region is formed over the substrate 51, and the substrate 51 of the peripheral region is exposed using the first capping layer 58. In the course of exposing the substrate 51 of the peripheral region, a portion of the isolation layer 52 may be lost. If a portion of the isolation layer 52 is lost, the surface of the active region 53 and the surface of the isolation layer 52 may be on the same plane in order to facilitate the subsequent process by performing additional processes on the active region 53 and the isolation layer 52.

Figure 3B:
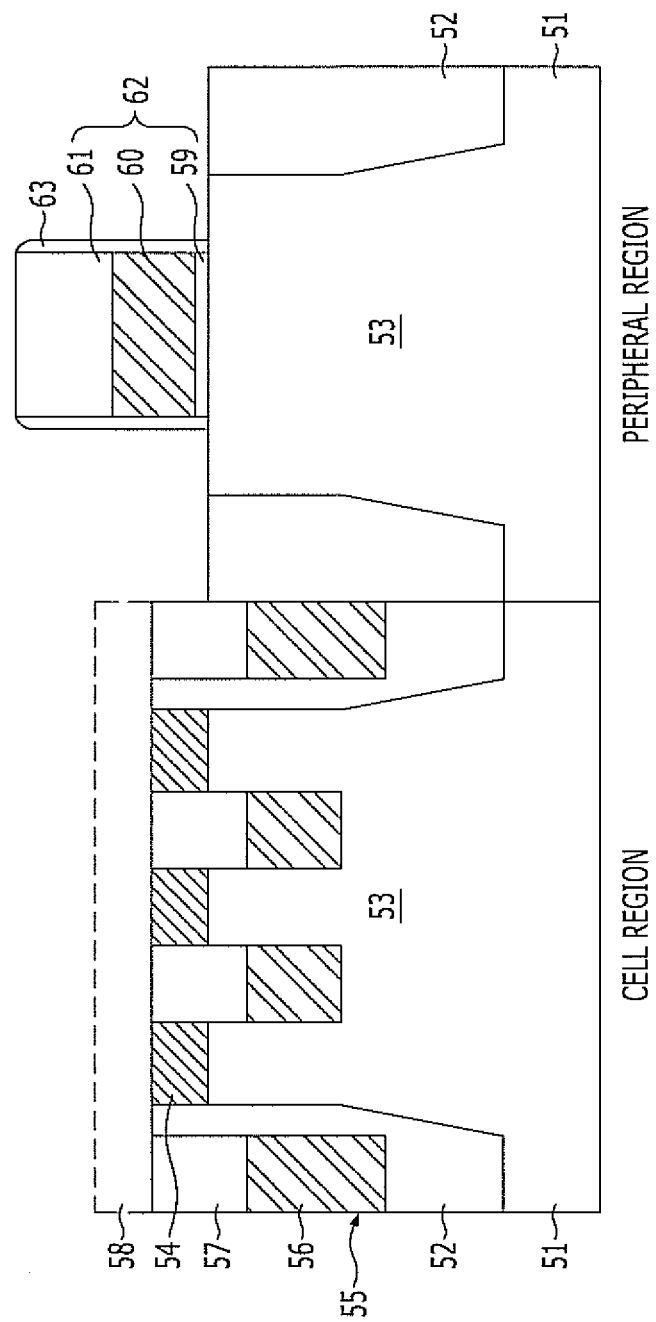

Referring to FIG. 3B, peripheral gates 62 are formed by sequentially stacking a peripheral gate insulation layer 59, a peripheral gate electrode 60, and a peripheral gate hard mask layer 61 over the substrate 51 of the peripheral region. The height of the peripheral gate hard mask layer 61 is controlled to be as low as possible so that the total height of the peripheral gates 62 may be as low as possible. The height of the peripheral gates 52 is set as low as possible to improve the gap-fill characteristics in the subsequent process that forms an inter-layer dielectric layer and to improve the stability of the process that forms the peripheral gates 62 by decreasing the aspect ratio of the peripheral gates 62. Moreover, when the peripheral gates 62 are formed to have a low height, the space where a peripheral bit line is to be formed may be stably provided.

Subsequently, spacers 63 are formed on the sidewalls of each peripheral gate 62, and the first capping layer 58 covering the cell region is removed.

Figure 3C:
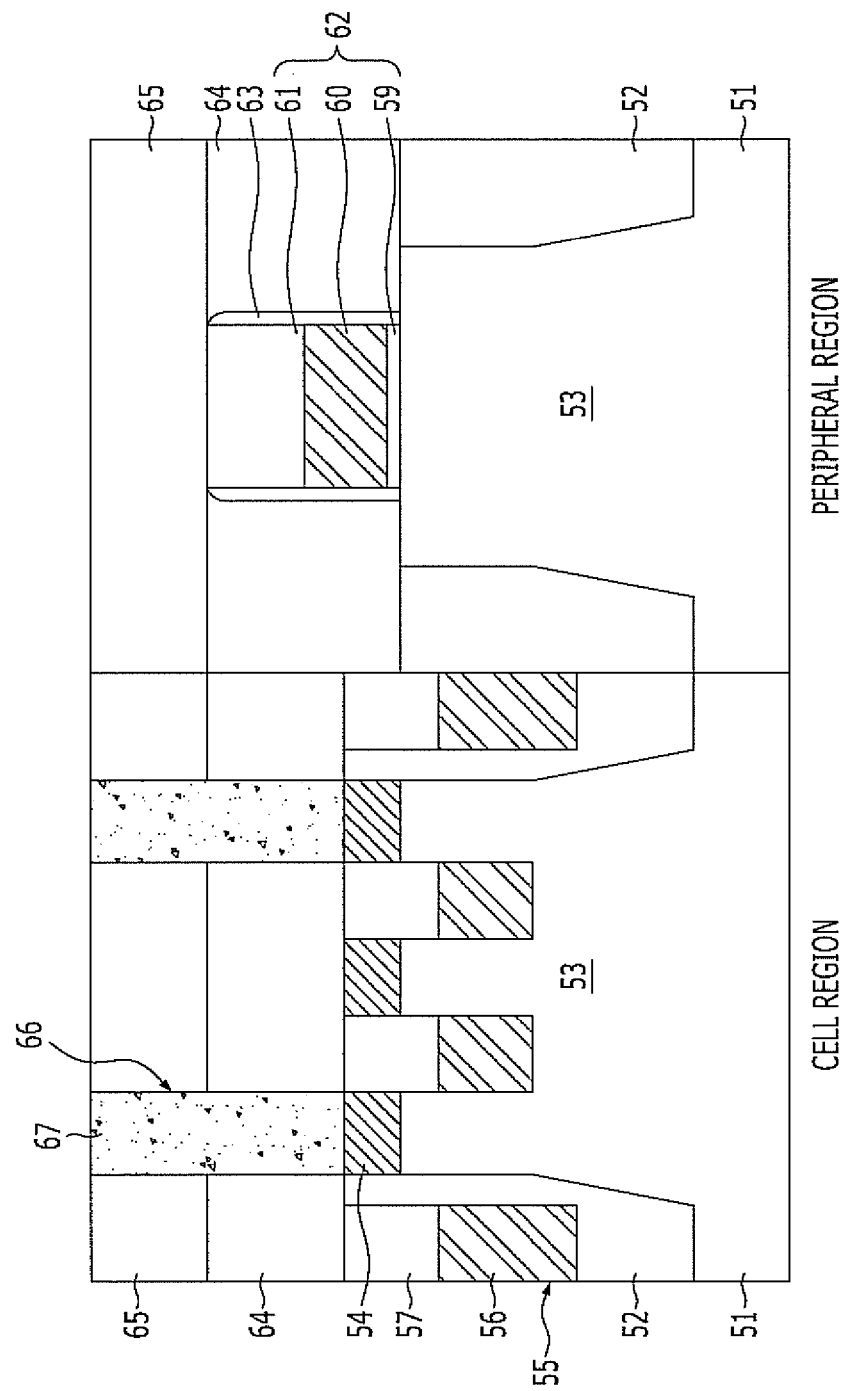

Referring to FIG. 3C, a first inter-layer dielectric layer 64 is formed to cover the entire surface of the substrate 51, and subsequently a planarization process is performed until the peripheral gates 62 are exposed. The planarization process may be a Chemical Mechanical Polishing (CMP) process.

Since the height of the peripheral gates 62 is made to be low, the first inter-layer dielectric layer 64 is easily gap-filled and many different materials may be used to form the first inter-layer dielectric layer 64. Therefore, a material having a better film quality but poorer gap-fill characteristics than the materials used in the conventional technology may be used to form the first inter-layer dielectric layer 64. Since the peripheral gates 62 have a high aspect ratio in the semiconductor device of the conventional technology, a material used in the conventional technology has excellent gap-fill characteristics, although a poor film quality, such as a Spin-On-Dielectric (SOD).

Subsequently, a second inter-layer dielectric layer 65 is formed over the first inter-layer dielectric layer 64. The second inter-layer dielectric layer 65 is formed to have a thickness to sufficiently provide a space where a cell bit line and storage node contact plugs of the cell region are to be formed and a space where a peripheral bit line of the peripheral region is to be formed. The second inter-layer dielectric layer 65 may be formed of the same material as the first inter-layer dielectric layer 64 to facilitate the subsequent process.

The second inter-layer dielectric layer 65 may be formed of a material having a lower porosity and a higher hardness than the first inter-layer dielectric layer 64. Also, the second inter-layer dielectric layer 65 may be formed of a material having a higher stability to an etch solution or a cleaning solution than the first inter-layer dielectric layer 64. As a result, the stability of the subsequent processes for forming storage node contact plugs and cell bit lines may be increased, and a short may be prevented from occurring between the storage node contact plugs and the cell bit line.

Subsequently, storage node contact holes 66 that expose the landing plugs 54 are formed by selectively etching the second inter-layer dielectric layer 65 and the first inter-layer dielectric layer 64. The storage node contact holes 66 may be formed in one shape selected from the group consisting of a hole type, a bar type, and a line type. The hole type shape individually exposes the landing plugs 54 of a region reserved for the storage node contact plugs. The bar type shape simultaneously exposes the landing plugs 54 of an adjacent region reserved for the storage node contact plugs. A line type shape simultaneously exposes the landing plugs 54 of a region reserved for the storage node contact plugs, which are disposed on the same line.

Subsequently, storage node contact plugs 67 are formed by filling the storage node contact holes 66 with a conductive material. The storage node contact plugs 67 may be formed through a series of processes of depositing a conductive layer to fill the storage node contact holes 66 and performing a planarization process until the second inter-layer dielectric layer 65 is exposed. Since the second inter-layer dielectric layer 65 is formed over the peripheral gate hard mask layer 61, the planarization process for isolating adjacent storage node contact plugs 67 may be performed easily.

Figure 3D:
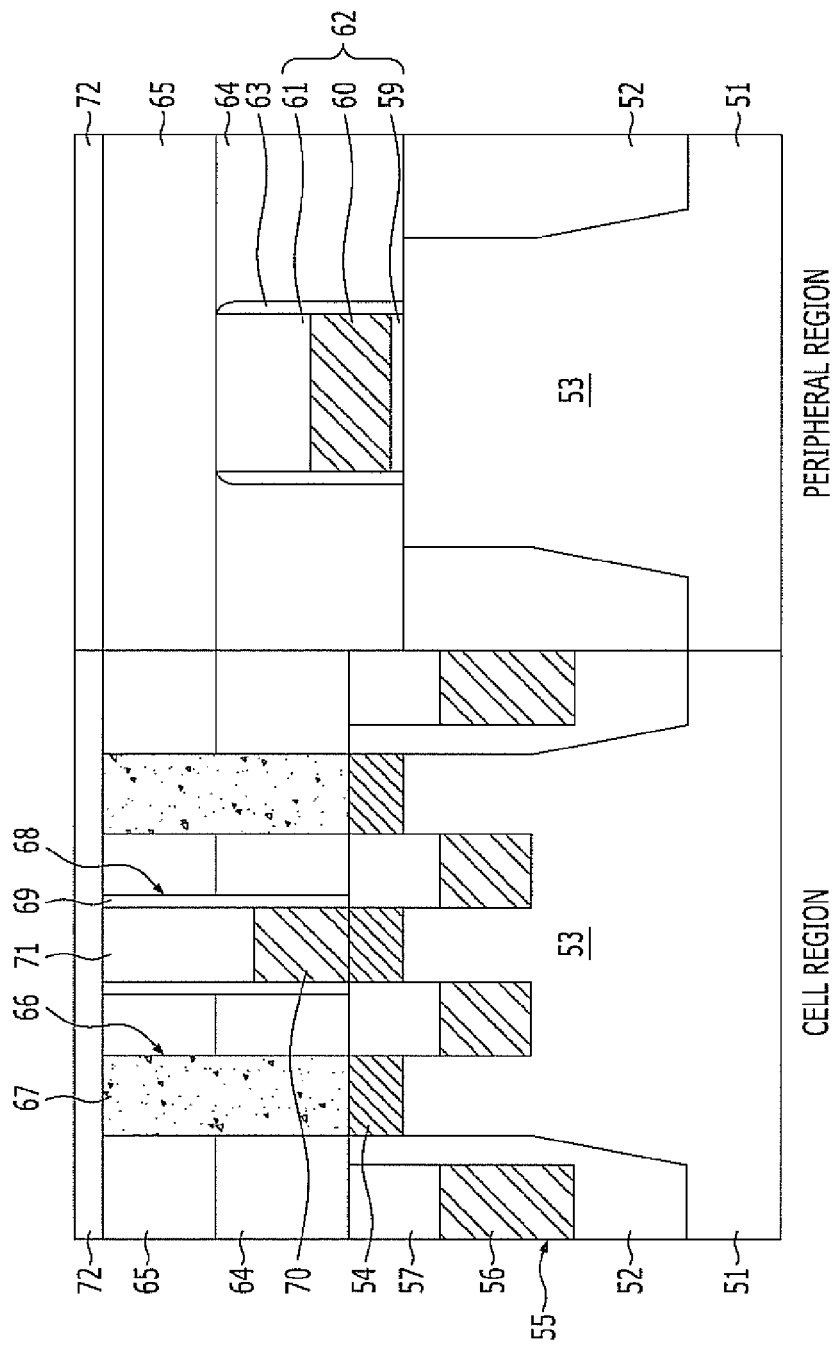

Referring to FIG. 3D, a cell damascene pattern 68 is formed by selectively etching the second inter-layer dielectric layer 65 and the first inter-layer dielectric layer 64 of the cell region. The cell damascene pattern 68 is formed to expose the landing plugs 54 disposed in the central portion of the active region 53. The cell damascene pattern 68 has a line shape stretched in a direction crossing the buried gates.

When the storage node contact holes 66 are formed in a bar type or a line type, the conductive layer filling the storage node contact holes 66 is etched along with the first inter-layer dielectric layer 64 and the second inter-layer dielectric layer 65 during the process of forming the cell damascene pattern 68, and through the etching process, the storage node contact plugs 67 are formed.

Subsequently, bit line spacers 69 are formed on the sidewalls of the cell damascene pattern 68. The bit line spacers 69 may be formed as a single layer selected from the group consisting of an oxide layer, a nitride layer, and an oxynitride layer, or a stacked layer thereof.

Subsequently, a cell bit line 70 that fills a portion of the cell damascene pattern 68 is formed, and a bit line hard mask layer 71 that fills the other portion of the cell damascene pattern 68 is formed over the cell bit lines 70.

Subsequently, a second capping layer 72 is formed over the substrate 51. The second capping layer 72 protects the structures that are already formed in the cell region from being damaged during a subsequent process that forms a peripheral bit line.

Figure 3E:
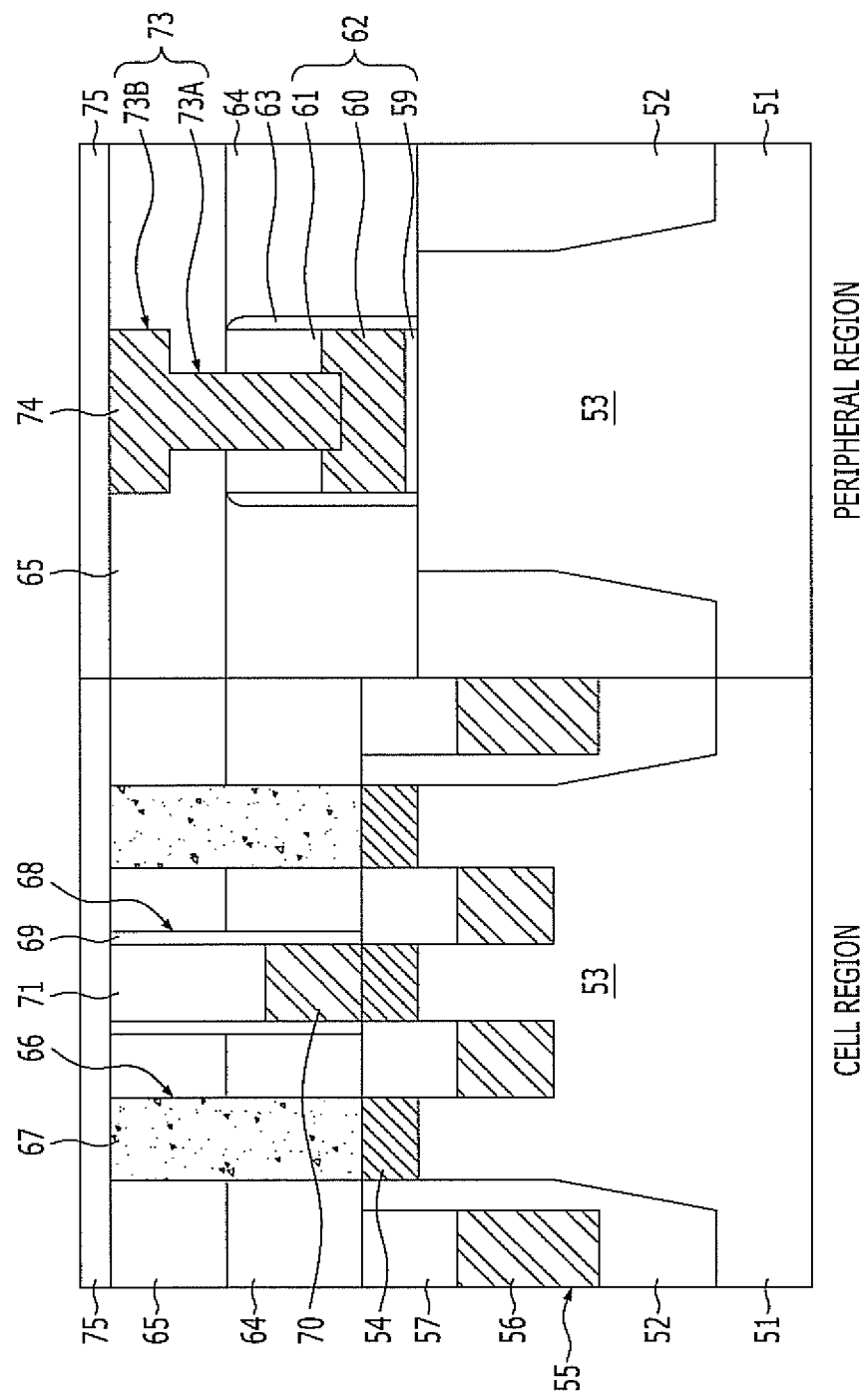

Referring to FIG. 3E, a hole pattern 73A that exposes the peripheral gate electrode 60 is formed by selectively etching the second capping layer 72, the second inter-layer dielectric layer 65, and the peripheral gate hard mask layer 61 of the peripheral region. Subsequently, a line pattern 73B coupled with the hole pattern 73A is formed by selectively etching the second capping layer 72 and the second inter-layer dielectric layer 65 of the peripheral region. As a result, a peripheral damascene pattern 73 including the hole pattern 73A and the line pattern 73B may be formed. The peripheral damascene pattern 73 provides a space where a peripheral bit line is to be formed.

Subsequently, a peripheral bit line 74 coupled with the peripheral gate electrode 60 is formed by forming spacers (not shown) on the sidewalls of the peripheral damascene pattern 73, and then depositing a conductive layer to fill the peripheral damascene pattern 73, and performing a planarization process until the second inter-layer dielectric layer 65 is exposed.

Subsequently, an etch stop layer 75 is formed over the substrate 51. Although not illustrated in the drawing, an insulation layer for a mold may also be formed over the etch stop layer 75, and a process for forming storage nodes and a wet dip-out process are sequentially performed.

According to an embodiment of the present invention, the formation of step height between a cell region and a peripheral region may be prevented by forming a peripheral bit line inside of an inter-layer dielectric layer. Therefore, procedural difficulty of a subsequent process for forming storage nodes in the cell region may be reduced, and the etch stop layer 75 may be protected from cracking caused by the presence of the step height.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a substrate having a cell region and a peripheral region;
    a buried gate formed over the substrate of the cell region;
    a peripheral gate formed over the substrate of the peripheral region and comprising a conductive layer;
    an inter-layer dielectric layer that covers the substrate; and
    a peripheral bit line formed inside the inter-layer dielectric layer and contacting the conductive layer,
    wherein the inter-layer dielectric layer comprises:
        a first inter-layer dielectric layer whose upper surface is disposed on the same plane as an upper surface of the peripheral gate, formed in the cell region and the peripheral region; and
        a second inter-layer dielectric layer formed over the first inter-layer dielectric layer and having a higher dielectric constant than the first inter-layer dielectric layer.

2. The semiconductor device of claim 1, further comprising:
    a storage node contact plug penetrating the inter-layer dielectric layer of the cell region;
    a cell damascene pattern penetrating the inter-layer dielectric layer of the cell region;
    bit line spacers formed on sidewalls of the cell damascene pattern;
    a cell bit line filling a portion of the cell damascene pattern; and
    a bit line hard mask layer filling the other portion of the cell damascene pattern.

3. The semiconductor device of claim 1, wherein the peripheral bit line fills a peripheral damascene pattern structure that includes a hole pattern that is formed in the inter-layer dielectric layer and exposes the conductive layer and a line pattern coupled with the hole pattern.

4. The semiconductor device of claim 1, wherein the first inter-layer dielectric layer and the second inter-layer dielectric layer are formed of the same materials.

5. The semiconductor device of claim 1, wherein the peripheral gate is formed at a different level from the buried gate.

6. The semiconductor device of claim 1, further comprising:
    a storage node contact plug penetrating the inter-layer dielectric layer of the cell region, wherein the peripheral bit line is formed at the same level as the storage node contact plug in the cell region.

* * * * *